United States Patent
Yeh (10) Patent No.: US 8,932,067 B2
(45) Date of Patent: Jan. 13, 2015

(54) ELECTRICAL CONNECTOR AND CARRIER THEREOF FOR ASSEMBLING IC PACKAGE

(71) Applicant: Hon Hai Precision Industry Co., Ltd., New Taipei (TW)

(72) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 111 days.

(21) Appl. No.: 13/851,121

(22) Filed: Mar. 27, 2013

(65) Prior Publication Data

US 2014/0011376 A1 Jan. 9, 2014

(30) Foreign Application Priority Data

Jul. 9, 2012 (TW) .............................. 101124560 A (51) Int. Cl.
*H01R 12/00* (2006.01)
*H05K 1/00* (2006.01)
*H05K 7/10* (2006.01)

(52) U.S. Cl.
CPC .................................... *H05K 7/1069* (2013.01)
USPC ......................................................... 439/68

(58) Field of Classification Search
CPC .............................. H05K 7/1069; H05K 7/10
USPC ........................................ 439/68–73, 330, 331
See application file for complete search history.

(56) References Cited

U.S. PATENT DOCUMENTS 7,210,951 B2 * 5/2007 Sinclair ......................... 439/259

FOREIGN PATENT DOCUMENTS

CN 202178462 U 3/2012

* cited by examiner

*Primary Examiner* — Javaid Nasri
(74) *Attorney, Agent, or Firm* — Wei Te Chung; Ming Chieh Chang (57) ABSTRACT

An electrical connector (100) for electrically connecting an IC package (9) with a substrate and includes an insulative housing (10) with a plurality of contacts (101) received therein, a load plate (3) pivotally covered the insulative housing (10), a carrier (8) assembled to the load plate (3) for holding the IC package (9) and a lock member (4) for positioning the load plate (3) in a closed position, the carrier (8) comprises a holding member (81) and a sliding member (83) assembled to the holding member (81), the holding member (81) and the sliding member (83) both comprises a position portion (8101, 8311) fastened with the load plate (3), and the sliding member (83) slides along the holding member (81) to make the position portion (8311) of the sliding member (83) fastened with the load plate (3).

18 Claims, 7 Drawing Sheets

ELECTRICAL CONNECTOR AND CARRIER THEREOF FOR ASSEMBLING IC PACKAGE

BACKGROUND OF THE INVENTION

1. Field of the Invention

The present invention relates to an electrical connector and carrier thereof for assembling IC package, and more particularly to an electrical connector using a carrier to hold and assemble the IC package to the electrical connector.

2. Description of Related Art

Chinese patent No. 202178462U issued to Cai on Mar. 28, 2012 discloses a conventional electrical connector for electrically connecting an IC package with a substrate. The electrical connector includes an insulative housing, a plurality of contacts received in the insulative housing, a frame located around the insulative housing, a load plate and a lever assembled to the frame, and a carrier assembled to the load plate. The load plate includes a plurality of holes. The carrier includes a plurality of protruding members positioned in the corresponding hole to position the carrier on the load plate. If to assemble the IC package to the electrical connector, paste the IC package to the carrier and position the carrier on the load plate, thus the IC package is assembled to the electrical connector by rotating the load plate to the closed position. Due to assemble the protruding members to the holes to position the carrier on the load plate, it is hard to assemble and the carrier is not stable on the load plate.

Hence, it is desirable to provide an improved electrical connector to overcome the aforementioned disadvantages.

SUMMARY OF THE INVENTION

Accordingly, an object of the present invention is to provide an electrical connector using a carrier to hold and assemble the IC package, at the same time, the carrier is easy assembled and positioned on the electrical connector stably.

According to one aspect of the present invention, an electrical connector for electrically connecting an IC package with a substrate and comprises an insulative housing, a plurality of contacts received in the insulative housing, a load plate pivotally covered the insulative housing, a carrier assembled to the load plate for holding the IC package and a lock member for positioning the load plate in a closed position. The carrier comprises a holding member and a sliding member assembled to the holding member. The holding member and the sliding member both comprises a position portion, and the sliding member slides along the holding member to make the position portion of the sliding member fastened with the load plate.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
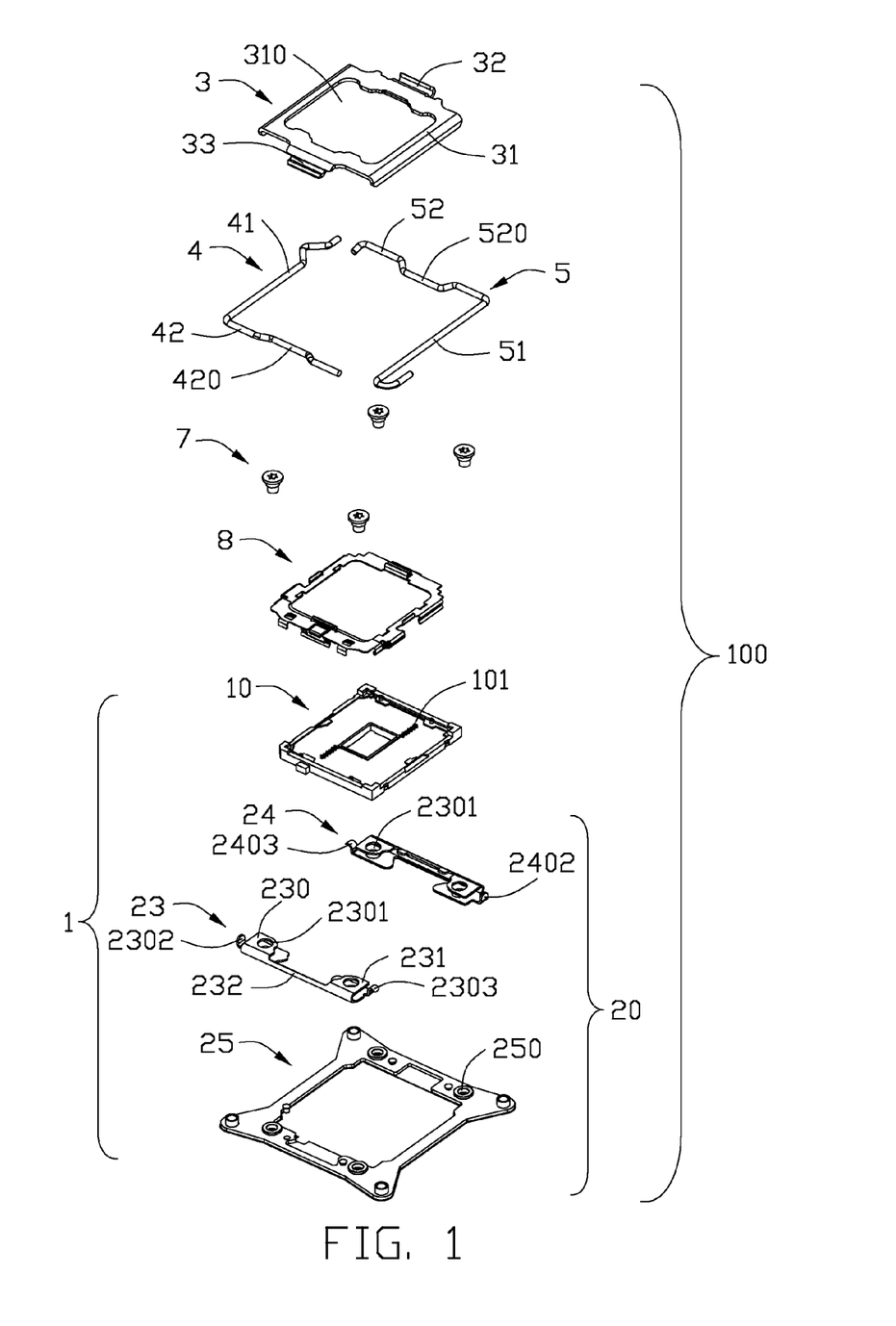
FIG. 1 is an exploded view of an electrical connector according to a preferred embodiment of the present invention.
Figure 7:
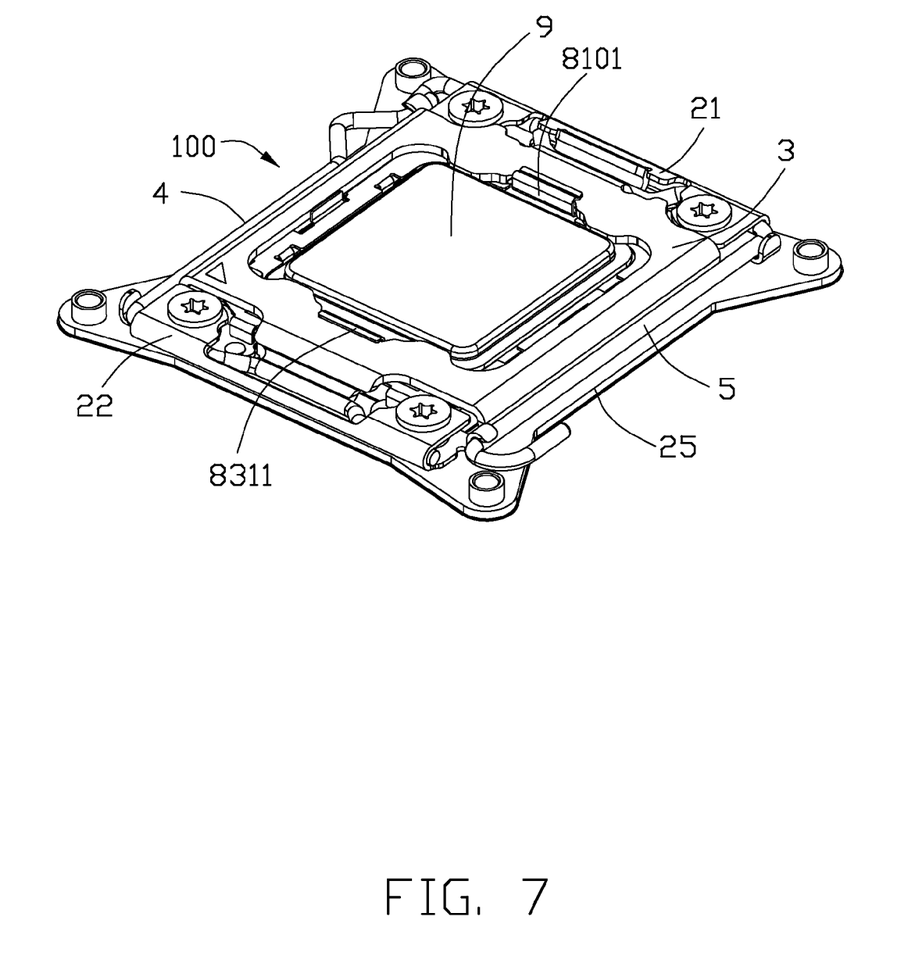
FIG. 7 is similar to FIG. 5, wherein the load plate is in a closed position.

FIGS. 1 and 7 illustrates an electrical connector 100 in accordance to a preferred embodiment of the present invention, the electrical connector 100 is used for electrically connecting an IC package 9 with a substrate (not labeled). The electrical connector 100 comprises an insulative housing 10, a plurality of contacts 101 received in the insulative housing 10, a load plate 3 pivotally covered the insulative housing 10, a carrier 8 assembled to the load plate 3 for holding the IC package 9 and a lock member 4 for positioning the load plate 3 in a closed position.

In this embodiment, the electrical connector 100 also comprises a stiffener 20 located outside the insulative housing 10. The stiffener 20 comprises a front end 21 and a rear end 22 opposite to the front end 21. The electrical connector 100 also comprises a shaft 5 assembled to the front end 21 of the stiffener 20. The lock member 4 is pivotally assembled to the rear end 22 of the stiffener 20. The load plate 3 is pivotally assembled to the shaft 5 in this embodiment. However, the load plate 3 can be assembled to the front end 21 of the stiffener 20 directly.

Referring to FIG. 1, the stiffener 20 comprises a frame 25 located around the insulative housing 10, a first retention member 23 and a second retention member 24 assembled to the opposite ends of the frame 25. The frame 25 includes a plurality of retention holes 250.

The first retention member 23 comprises a first part 230, a second part 231 and a connection portion 232 connecting the first part 230 and the second part 232. The second part 231 comprises a first interlock portion 2303 extending downwardly used for interlocking with the shaft 5. The first part 230 comprises a first resist portion 2302 extending upwardly to prevent the horizontal movement of the lock member 4. The first part 230 and the second part 231 both comprises a plurality of position holes 2301 corresponding to the retention hole 250 of the frame 25.

The second retention member 24 has a same shape with the first retention member 23. The second retention member 24 comprises a second interlock portion 2403 extending downwardly, a second resist portion 2402 extending upwardly and a plurality of position holes 2301 corresponding to the retention hole 250 of the frame 25. The second interlock portion 2403 is used for interlocking with the lock member 4, and the second resist portion 2402 is used to prevent the horizontal movement of the shaft 5.

Referring to FIG. 1 and FIG. 7, the lock member 4 is assembled to the first retention member 23. The lock member 4 comprises a fix portion 42 and an operation portion 41 perpendicular to the fix portion 42. The fix portion 42 is fixed to the first part 230 and the second part 231. The fix portion 42 includes a press portion 420 in the middle thereof. The shaft 5 has a similar shape with the lock member 4 and is fixed to the second retention member 24. The shaft 5 comprises a fix part 52 and an operation part 51 perpendicular with the fix part 52. The fix part 52 is fixed to the second retention member 24. The fix part 52 includes an interlock part 520 in the middle thereof.

In this embodiment, the load plate 3 is made of metal material and comprises a main portion 31 with a frame shape, a first tongue portion 32 and a second tongue portion 33 extending from opposite ends of the main portion 31. The main portion 31 includes an opening 310 to permit exposing of the IC package 9. The first tongue portion 32 is interlocked with the interlock part 520 of the shaft 5. The press portion 420 of the lock member 4 pressed on the second tongue portion 33.

Figure 2:
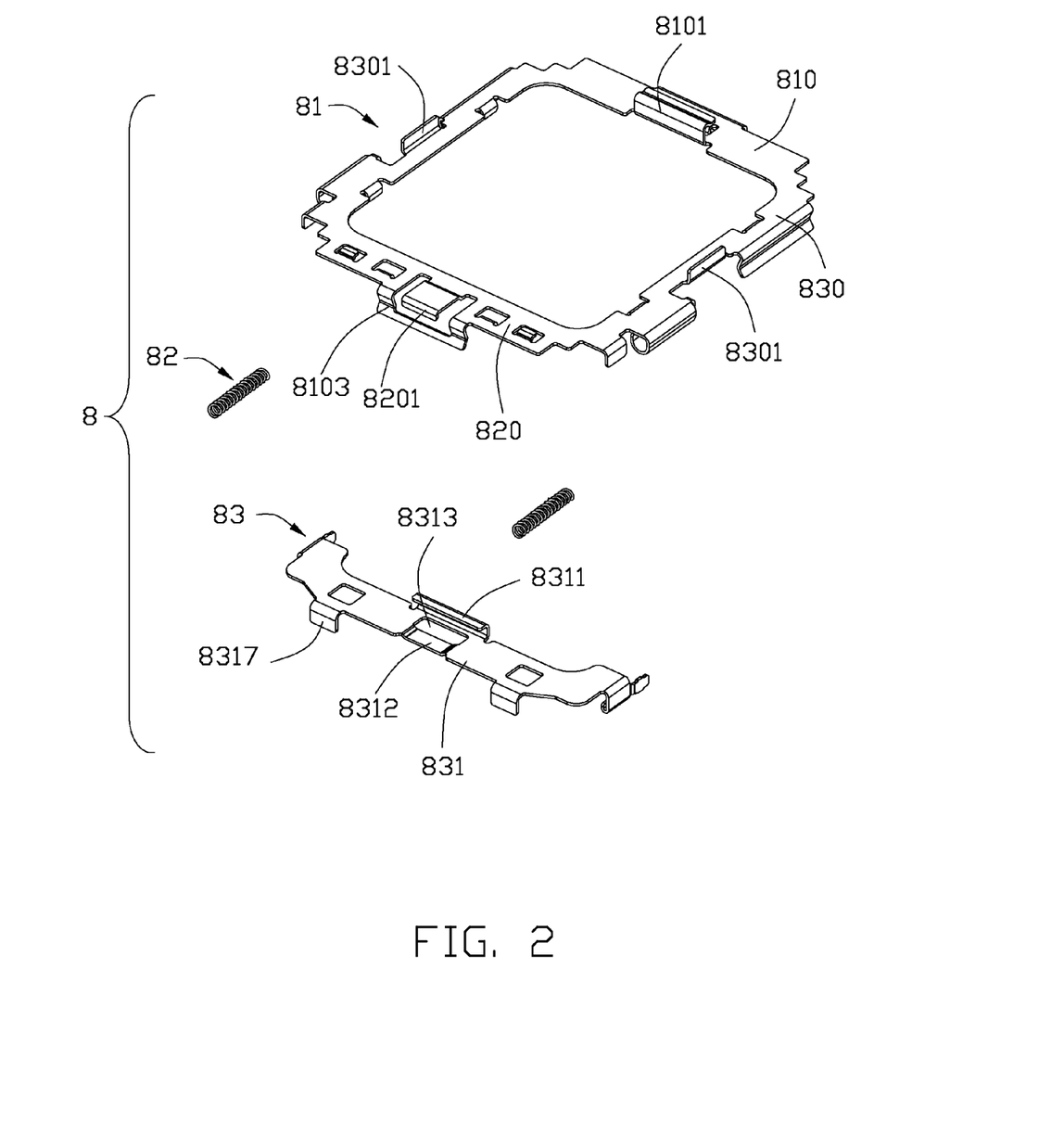
FIG. 2 is an exploded view of the carrier as shown in FIG. 1.
Figure 3:
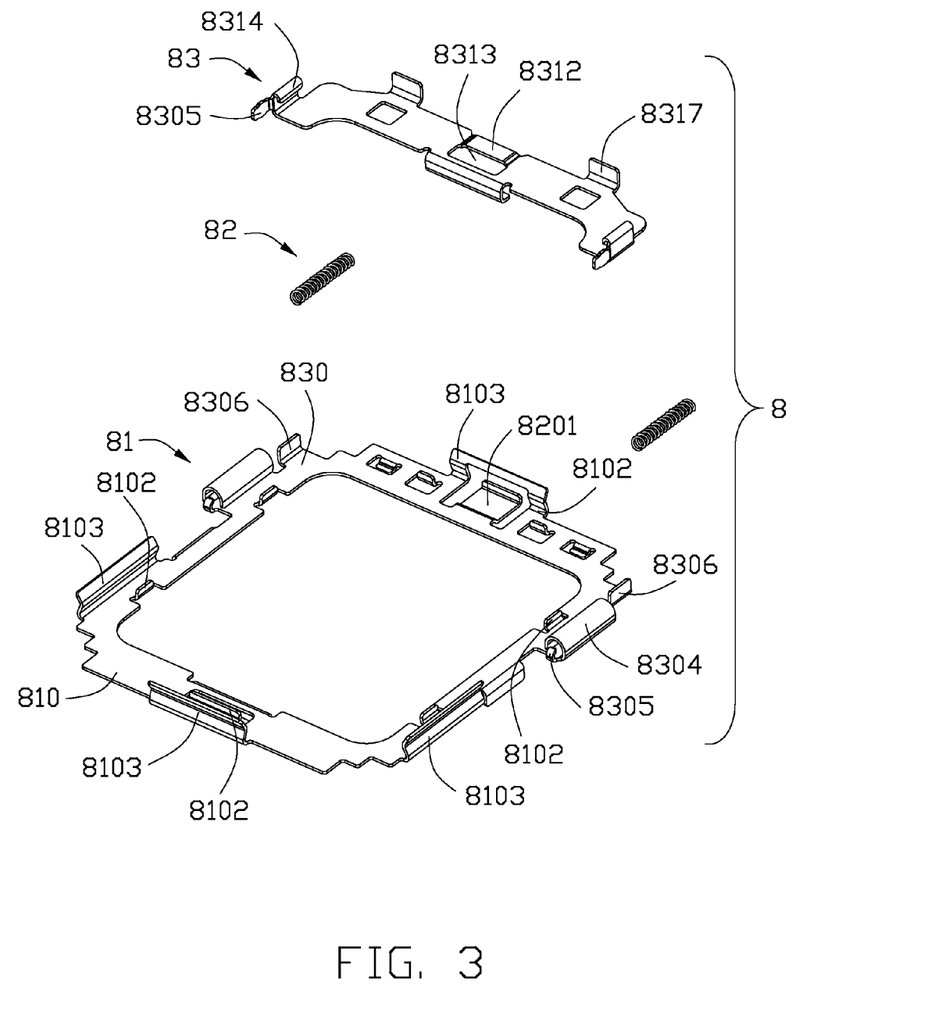
FIG. 3 is another view of the carrier as shown in FIG. 2.

Referring to FIGS. 2-3, the carrier 8 comprises a holding member 81, a sliding or moving/deflecting member 83 assembled to the holding member 81 and a spring member 82 positioned between the holding member 81 and the sliding member 83.

The holding member 81 includes a first end 810, a second end 820 opposite to the first end 810 and a pair of third ends 830 connecting the first end 810 and the second end 820. The first end 810, the second end 820 and the pair of third ends 830 all includes a guiding portion 8103 and a restrict portion 8102 extending downwardly. The restrict portions 8102 locates on the outside of the IC package 9 to restrict the IC package 9. Each of the third ends 830 comprises an orientate portion 8301 extending upwardly, a limit portion 8306, a receiving portion 8304 and a first holding portion 8201 extending downwardly, and an extending portion 8305 extending from the receiving portion 8304. The first end 810 includes a position portion 8101 extending upwardly and curvedly. The second end 820 includes a first holding portion 8201 extending downwardly.

The sliding member 83 includes a body portion 831, a position portion 8311 extending upwardly, a hand portion 8317, a push portion 8314 and a second holding portion 8312 extending downwardly, another extending portion 8305 extending from the push portion 8314 and a receiving hole 8313 located at one side of the second holding portion 8312.

Figure 4:
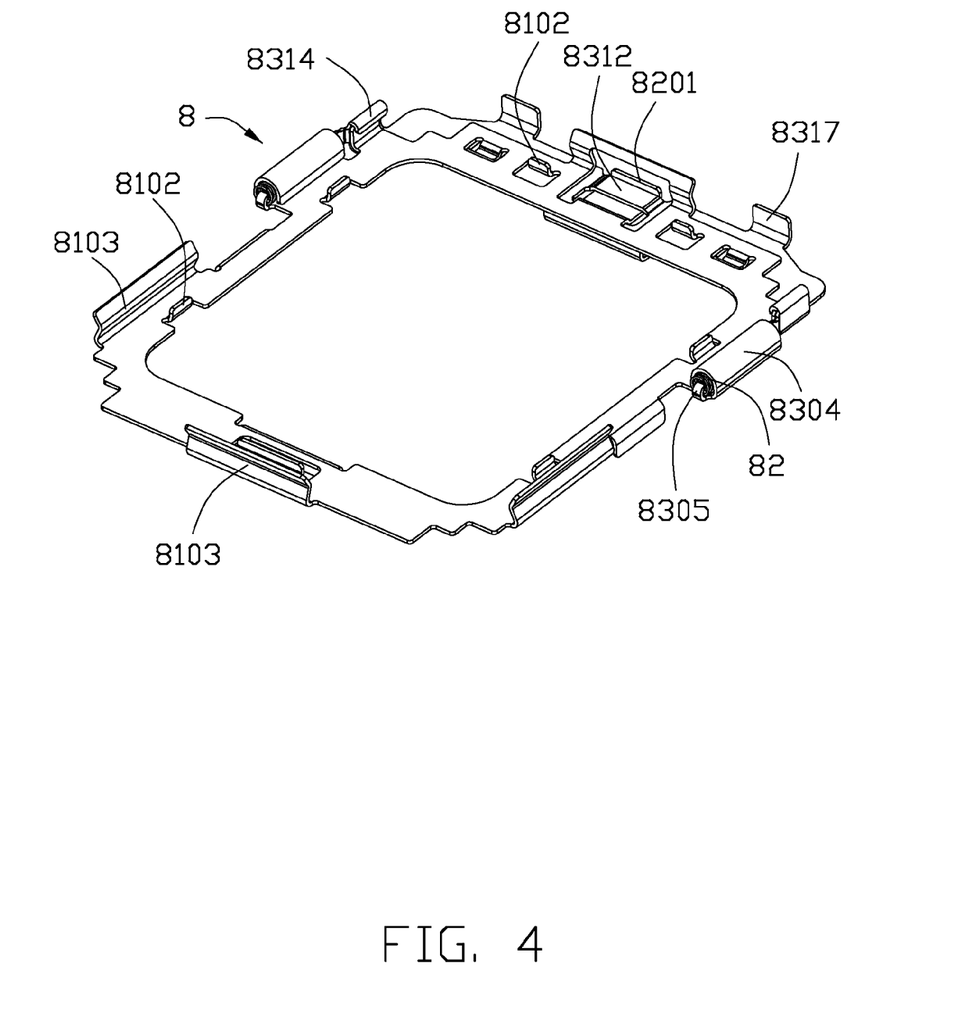
FIG. 4 is assembled view of the carrier as shown in FIG. 2.

FIG. 4 shows the assembled view of the carrier 8. The spring member 82 is received in the receiving portion 8304 of the holding member 81. The extending portion 8305 of the holding member 81 partly receives in one end of the spring 82. The sliding member 83 is assembled to the second end 820 of the holding member 81. The limit portion 8306 of the holding member 81 is assembled with the push portion 8314 of the sliding member 83. The first holding portion 8201 of the holding member 81 is received in the receiving hole 8313 and interlocked with the second holding portion 8312 of the sliding member 83 to to prevent the sliding member 83 escaped from the holding member 81. The extending portion 8305 of the sliding member 83 partly receives in other end of the spring 82. When push the hand portion 8317 of the sliding member 83, the push portion 8314 presses the spring 82, when release the hand portion 8317, the elastic force of the spring 82 make the sliding member 83 slide along the holding member 81. The sliding of the sliding member 83 along the holding member 81 to makes the distance of the two position portions 8101, 8311 become short or long.

Figure 5:
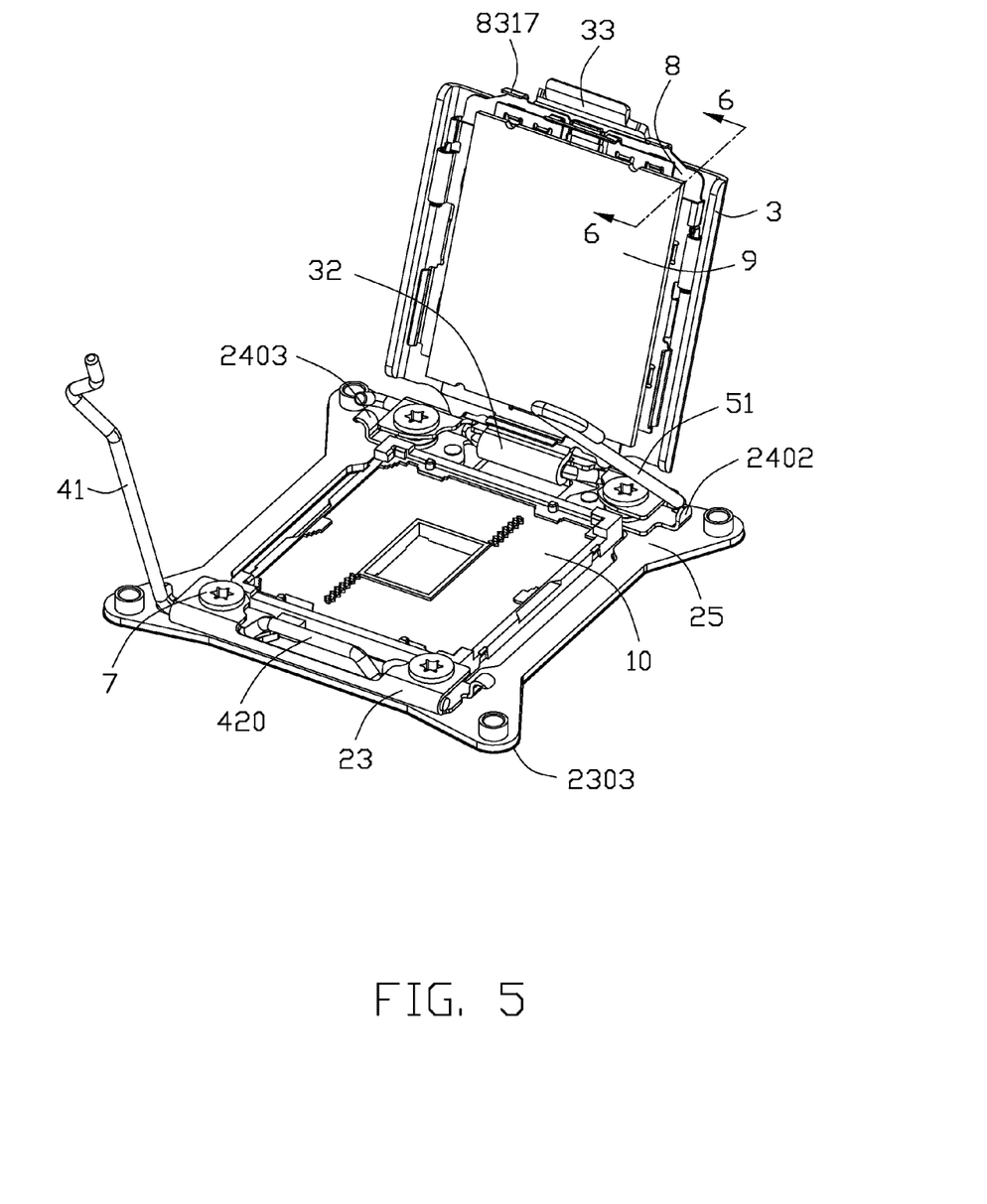
FIG. 5 is an assembled view of the electrical connector as shown in FIG. 1, wherein the load plate is in an opened position.

Referring to FIG. 5, when the electrical connector is assembled, the screw 7 goes through the position holes 2301 of the first retention member 23 or the second retention member 24 and the retention holes 250 of the frame 25 to fix the first retention member 23 or the second retention member 23 to the frame 25, the lock member 4 is fixed to the first retention member 23, the shaft 5 is fixed to the second retention member 24 and the load plate 3 is fixed to the shaft 5.

Figure 6:
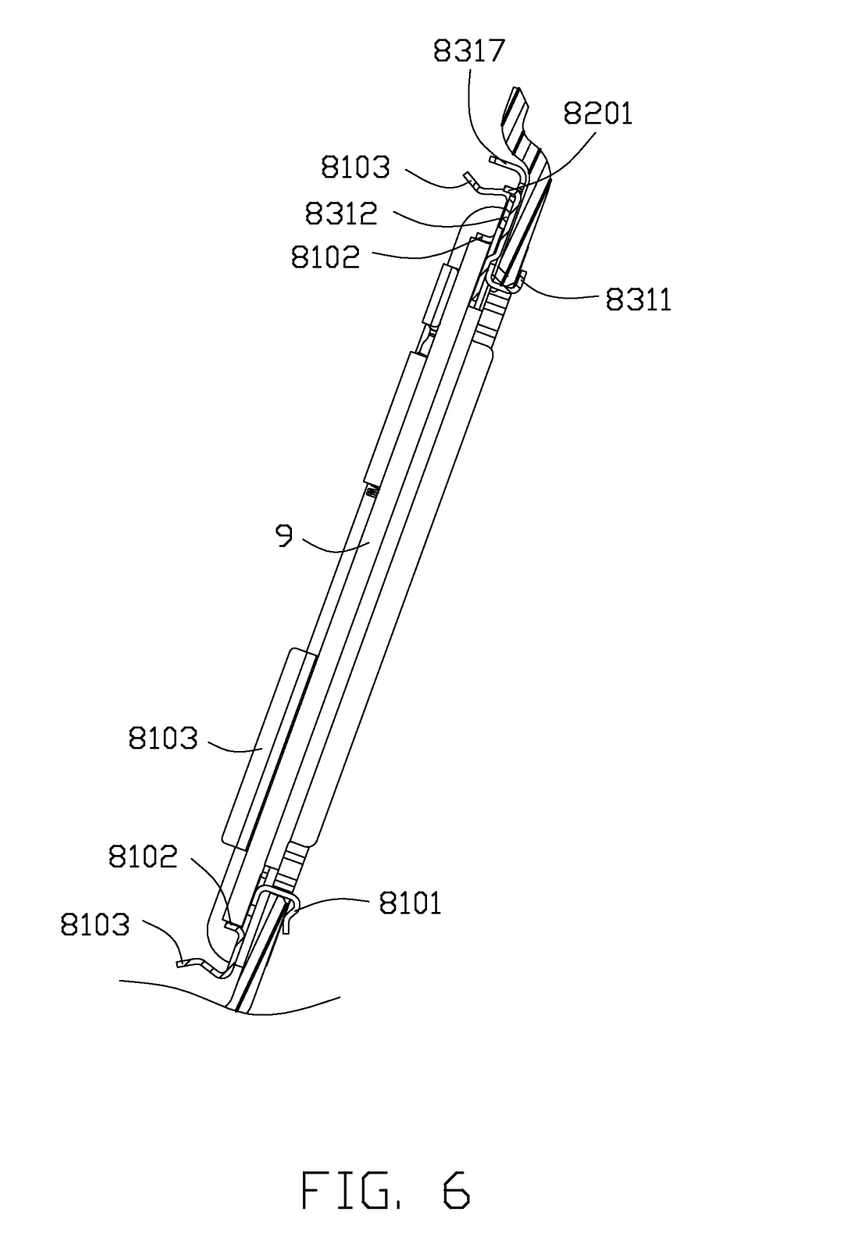
FIG. 6 is a cross-sectional view of the electrical connector taken along line 6-6 in FIG. 5.

FIGS. 5-7 shows the process of assembled the IC package 9. Firstly, the IC package 9 is pasted or through other method fixed to the carrier 8; secondly, the carrier 8 is assembled to the load plate 3; thirdly, the load plate 3, the lock member 4 and the shaft 5 is rotated to the closed position, and then the IC package 9 is assembled to the insulative housing 10. The guiding portions 8103 of the holding member 81 locate outside of the insulative housing 10 to make the IC package 9 assembled to the insulative housing 10 accurately.

When assembled the carrier 8 to the load plate 3, the position portion 8101 of the holding member 81 is positioned in the opening 310 of the load plate 3 and locked with the load plate 3, and then push the hand portion 8317 of the sliding member 83 to make the sliding member 83 slide along the holding member 81, thus the distance between the two position portion 8101, 8311 becomes short, and then make the position portion 8311 of the sliding member 83 position in the opening 310 of the load plate 3 and lock with the load plate 3. The orientate portions 8301 of the holding member 81 located in the opening 310 of the load plate 3 to make the carrier 8 fix in the load plate 3 accurately.

The carrier 8 in this invention includes a holding member 81 and a sliding member 83 assembled to the holding member 81, the holding member 81 and the sliding member 83 both includes a position portion 8101, 8311 locked with the load plate 3, the sliding member 83 slides along the holding member 81 to make the distance of the two position portions 8101, 8311 short or long to make the carrier released from or locked with the load plate 3, it is easy to assemble the carrier 8 and the carrier 8 is fixed on the load plate 3 securely.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an IC package with a substrate, comprising:
an insulative housing;
a plurality of contacts received in the insulative housing;
a load plate pivotally covered the insulative housing;
a carrier assembled to the load plate for holding the IC package; and
a lock member positioned the load plate in a closed position; wherein
the carrier comprises a holding member and a sliding member assembled to the holding member; wherein
the holding member and the sliding member both comprises a position portion, the sliding member slides along the holding member to make the two position portions fastened with the load plate.

2. The electrical connector as claimed in claim 1, wherein the load plate includes an opening, the sliding member slides along the holding member to make the distance of the two position portions short so that the two position portions can locate in the opening and then the sliding member slides along the holding member to make the two position portions lock with the load plate.

3. The electrical connector as claimed in claim 2, wherein the holding member further comprises orientate portion located in the opening.

4. The electrical connector as claimed in claim 1, wherein the carrier further comprises a spring located between the holding member and the sliding member.

5. The electrical connector as claimed in claim 4, wherein the holding member comprises a receiving portion, the spring receives in the receiving portion.

6. The electrical connector as claimed in claim 5, wherein the sliding member comprises an extending portion received in the spring.

7. The electrical connector as claimed in claim 1, wherein the holding member comprises a first holding portion and the sliding member comprises a second holding portion interlocked with the first holding portion to prevent the sliding member escaped from the holding member.

8. The electrical connector as claimed in claim 1, wherein the electrical connector further comprises a stiffener located outside the insulative housing, the lock member and the load plate are assembled to the two opposite ends of the stiffener.

9. A carrier for assembling an IC package, comprising: a holding member; a sliding member assembled to the holding member; and a spring located between the holding member and the sliding member; wherein the holding member and the sliding member both comprises a position portion, the sliding member slides along the holding member to make a distance of the two position portions short or long;

Wherein
the holding member comprises a receiving portion, the spring receives in the receiving portion;
wherein
the sliding member comprises an extending portion received in the spring.

10. The carrier as claimed in claim 9, wherein the holding member comprises a first holding portion and the sliding member comprises a second holding portion interlocked with the first holding portion to prevent the sliding member escaped from the holding member.

11. An electrical connector for use with an electronic package, comprising:
a rectangular insulative housing defining a front-to-back direction thereof, and an receiving cavity upwardly facing to an exterior in a vertical direction perpendicular to said front-to-back direction for receiving said electronic package therein;
a plurality of contacts disposed in the housing for contacting the electronic package;
a metallic load plate with one fixed end pivotally mounted around one end of the housing in said front-to-back direction, and with one free end, opposite to said fixed end, adapted to be locked by a locking member which is located around the other end of the housing in said front-to-back direction; and
a carrier assembled to the load plate so as to move along with the load plate during operation, said carrier including a holding member for attachment of said electronic package thereon, and a moving member discrete from but assembled to the holding member in a moveable manner; wherein
said carrier is located inside of said load plate.

12. The electrical connector as claimed in claim 11, wherein said moving member is moved in a sliding manner along said front-to-back direction.

13. The electrical connector as claimed in claim 12, further including a spring provided between the holding member and the moving member to ensure reliable attachment of the carrier with regard to the load plate.

14. The electrical connector as claimed in claim 11, wherein said holding member defines an underside for abutment with the electronic package.

15. The electrical connector as claimed in claim 14, wherein said underside is applied with adhesive for attaching the electronic package thereon.

16. The electrical connector as claimed in claim 11, wherein the fixed end is essentially moveable about a moveable pivot which is rotated about fixed pivot.

17. The electrical connector as claimed in claim 16, wherein said moveable pivot and said fixed pivot are both formed on a same shaft in an mutually offset manner.

18. The electrical connector as claimed in claim 11, wherein said load plate defines an opening for allowing a heat sink of said electronic package to extend therethrough, and the carrier member includes means gripping around said opening for attachment of said carrier member with regard to said load plate.

* * * * *